(12) United States Patent
Koide et al.

(10) Patent No.: US 8,097,538 B2
(45) Date of Patent: Jan. 17, 2012

(54) METHOD OF MANUFACTURING SEMICONDUCTOR DEVICE

(75) Inventors: Tatsuhiko Koide, Mie (JP); Hisashi Okuchi, Kanagawa (JP); Hidekazu Hayashi, Kanagawa (JP); Hiroshi Tomita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 12/715,727

(22) Filed: Mar. 2, 2010

(65) Prior Publication Data

US 2010/0267233 A1 Oct. 21, 2010

(30) Foreign Application Priority Data

Apr. 17, 2009 (JP) ................... 2009-100850

(51) Int. Cl.
*H01L 21/461* (2006.01)
(52) U.S. Cl. ........ 438/669; 438/677; 438/592; 438/595; 438/906; 257/E21.428
(58) Field of Classification Search ............ 438/677, 438/592, 587, 588, 595, 906, 669; 134/1.3; 257/E21.428
See application file for complete search history.

(56) References Cited

U.S. PATENT DOCUMENTS

| | | | | |
|---|---|---|---|---|
| 5,747,669 | A * | 5/1998 | Suzuki | 73/23.21 |
| 7,749,909 | B2 * | 7/2010 | Tomita et al. | 438/694 |
| 7,838,425 | B2 * | 11/2010 | Tomita et al. | 438/690 |
| 2005/0176254 | A1 | 8/2005 | Takeishi et al. | |
| 2006/0115982 | A1 * | 6/2006 | Morisue et al. | 438/638 |
| 2009/0311874 | A1 | 12/2009 | Tomita et al. | |

FOREIGN PATENT DOCUMENTS

| | | |
|---|---|---|
| JP | 5-299336 | 11/1993 |
| JP | 7-142349 | 6/1995 |
| JP | 7-273083 | 10/1995 |
| JP | 3866130 | 10/2006 |

OTHER PUBLICATIONS

Tomita, "Method of Treating a Semiconductor Substrate", U.S. Appl. No. 12/574,543, filed Oct. 6, 2009.

* cited by examiner

*Primary Examiner* — Michael Trinh
(74) *Attorney, Agent, or Firm* — Finnegan, Henderson, Farabow, Garrett & Dunner, L.L.P.

(57) ABSTRACT

A metal member layer on a silicon member layer is patterned. A sidewall film is formed on a surface of the metal member layer. The silicon member layer is patterned to form a structure including the silicon member layer and the metal member layer, the surface of which is covered with the sidewall film. After the surface of the structure is cleaned, a water-repellent protective film is formed on the surface of the structure before the surface of the structure is dried.

20 Claims, 11 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2009-100850, filed on Apr. 17, 2009; the entire contents of which are incorporated herein by reference.

BACKGROUND OF THE INVENTION

1. Field of the Invention

The present invention relates to a method of manufacturing a semiconductor device.

2. Description of the Related Art

In a process for manufacturing a semiconductor device, treatment for supplying treatment liquid such as chemical or pure water to the surface of a semiconductor wafer is performed. In particular, in treatment for cleaning the wafer, chemical for the cleaning treatment is supplied to the surface of the wafer and then rinse treatment by the supply of the pure water is performed. After the rinse treatment, drying treatment for removing the pure water remaining on the surface of the wafer and drying the wafer is performed. As a method of the drying treatment, there is a method of substituting the pure water on the wafer with, for example, isopropyl alcohol (IPA) and drying the surface of the wafer (see, for example, Japanese Patent No. 3866130).

In the treatment for drying the wafer, occurrence of a phenomenon in which patterns on the wafer collapse is a problem. To solve such a problem, a method of using liquid having low surface tension such as hydrofluoroether (HFE) instead of the IPA and a method of using a supercritical process are proposed. However, according to the microminiaturization of patterns in recent years, it is difficult to suppress the collapse of the patterns even if the liquid having low surface tension is used. In the case of the supercritical process, patterns collapse because moisture or the like intrudes into a supercritical atmosphere in a chamber. It is difficult to establish a mass production technology.

BRIEF SUMMARY OF THE INVENTION

A method of manufacturing a semiconductor device according to an embodiment of the present invention comprises: forming a silicon member layer using a silicon material; forming a metal member layer using a metal material on the silicon member layer; patterning the metal member layer; forming a sidewall film on a surface of the patterned metal member layer; patterning the silicon member layer to thereby form a structure including the silicon member layer and the metal member layer, the surface of which is covered with the sidewall film; cleaning a surface of the structure using chemical; forming a water-repellent protective film on the surface of the structure; rinsing the surface of the structure on which the water-repellent protective film is formed; and drying the surface of the structure.

A method of manufacturing a semiconductor device according to an embodiment of the present invention comprises: forming a first metal member layer using a metal material; forming a silicon member layer using a silicon material on the first metal member layer; forming a second metal member layer using a metal material on the silicon member layer; patterning the second metal member layer; forming a sidewall film on a surface of the patterned second metal member layer; patterning the silicon member layer and the first metal member layer to thereby form a structure including the first metal member layer, the silicon member layer, and the second metal member layer, the surface of which is covered with the sidewall film; cleaning a surface of the structure using chemical; forming a water-repellent protective film on the surface of the structure; rinsing the surface of the structure on which the water-repellent protective film is formed; and drying the surface of the structure.

A method of manufacturing a semiconductor device according to an embodiment of the present invention comprises: patterning, in a line shape extending in a first direction, a stacked body including a first wiring layer and a recording layer and an electrode layer forming a recording section; forming, on the patterned stacked body, a silicon member layer forming a rectifying element layer, a barrier layer, and a second wiring layer; patterning the second wiring layer and the barrier layer in a line shape extending in a second direction non-parallel to the first direction; forming a sidewall film on surfaces of the patterned second wiring layer and barrier layer; patterning the silicon member layer in a line shape extending in the second direction to thereby form a structure including the silicon member layer and the second wiring layer and the barrier layer, the surfaces of which are covered with the sidewall film; cleaning a surface of the structure using chemical; forming a water-repellent protective film on the surface of the structure; rinsing the surface of the structure on which the water-repellent protective film is formed; drying the surface of the structure; and forming a memory cell including the recording section in a section where the first wiring layer and the second wiring layer cross each other.

DETAILED DESCRIPTION OF THE INVENTION

Exemplary embodiments of method of manufacturing semiconductor device according to the present invention will be explained below in detail with reference to the accompanying drawings. The present invention is not limited to the following embodiments.

Figure 1:
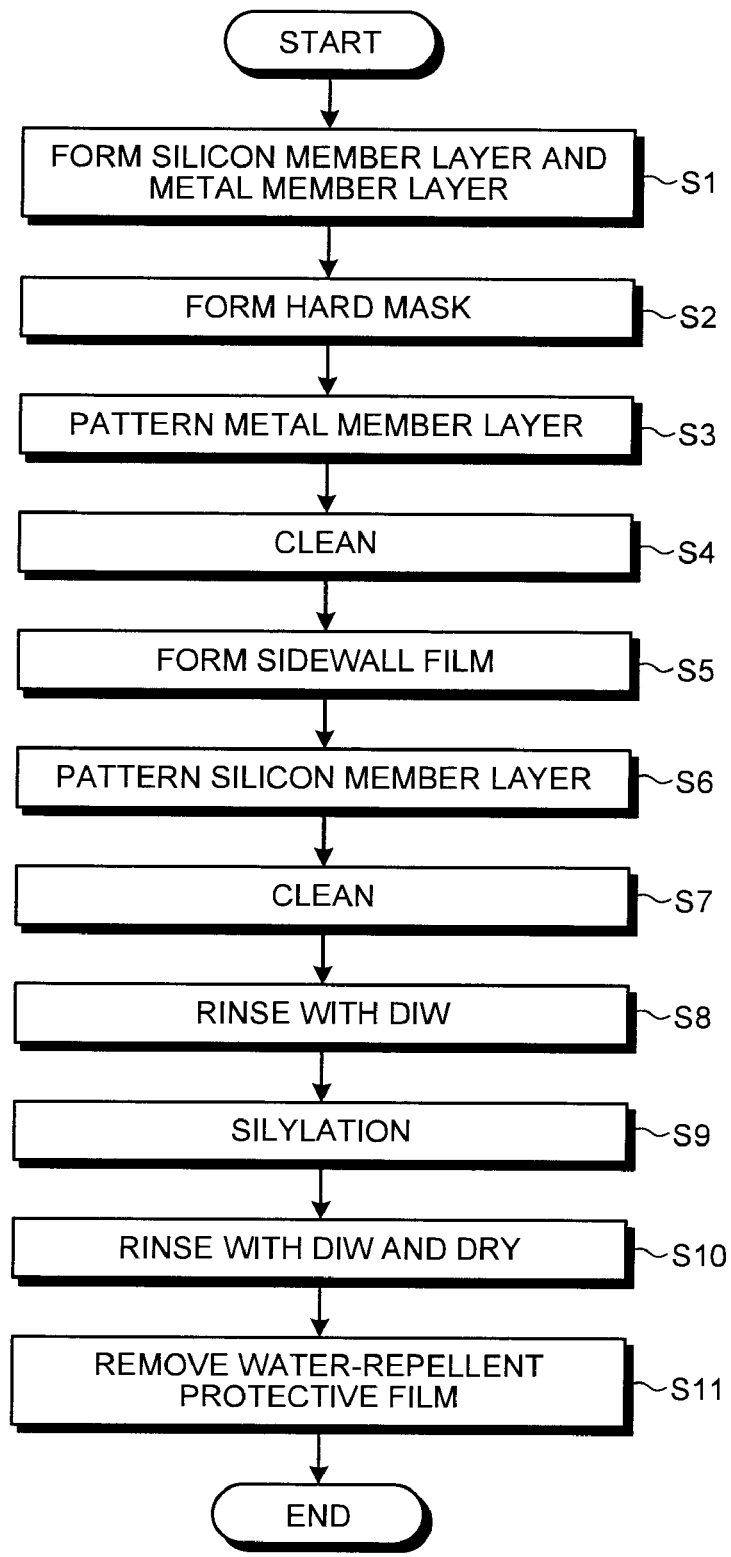
FIG. 1 is a flowchart for explaining a procedure of a method of manufacturing a semiconductor device according to a first embodiment of the present invention.

FIG. 1 is a flowchart for explaining a procedure of a method of manufacturing a semiconductor device according to a first embodiment of the present invention. FIGS. 2A to 2J are schematic sectional views for explaining a process for manufacturing a semiconductor device. In this embodiment, manufacturing of patterns from a structure including a metal member layer 13 in an upper layer and a silicon member layer 12 in a lower layer includes a process for forming a sidewall film 17 and a process for applying silylation treatment. The manufacturing method according to this embodiment is suitable for manufacturing, for example, a resistance random access memory (ReRAM) as a semiconductor device.

Figure 2A:
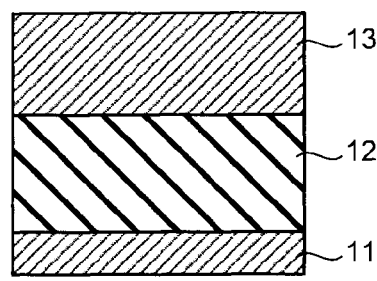
FIGS. 2A to 2J are schematic sectional views for explaining a process for manufacturing a semiconductor device.

At step S1, as shown in FIG. 2A, the silicon member layer 12 and the metal member layer 13 are sequentially formed on a wiring layer 11 made of a wiring material. The silicon member layer 12 is formed by using a silicon material such as silicon oxide or polysilicon. The metal member layer 13 is formed by using a metal material.

Figure 2B:
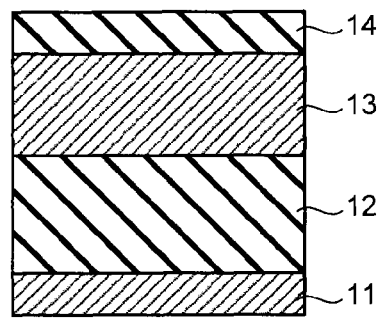
Figure 2C:
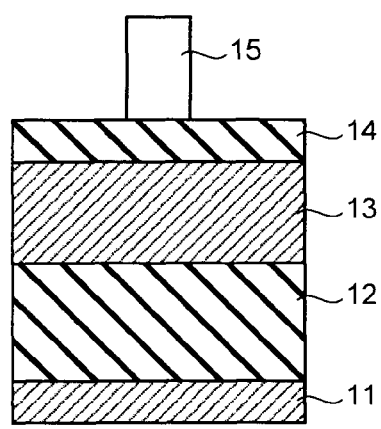
Figure 2D:
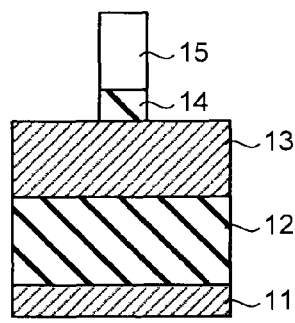
Figure 2E:
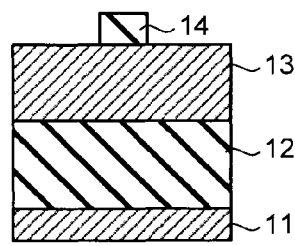

At step S2, as shown in FIG. 2B, a hard mask 14 is formed on the metal member layer 13. The hard mask 14 is formed by using, for example, silicon oxide. As shown in FIG. 2C, a resist layer 15 is formed on the hard mask 14 and processed into a desired pattern. After the resist layer 15 is patterned, as shown in FIG. 2D, the hard mask 14 is patterned by applying dry etching thereto. After the hard mask 14 is patterned, as shown in FIG. 2E, the resist layer 15 is stripped.

Figure 2F:
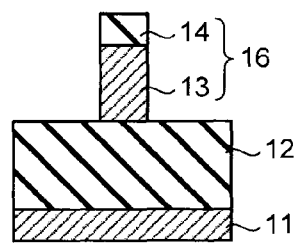

At step S3, as shown in FIG. 2F, the metal member layer 13 is patterned by applying dry etching thereto. At step S3, the silicon member layer 12 under the metal member layer 13 is not processed. At step S4, to remove residues caused by the dry etching at step S3, the surface of a structure 16 formed by the process up to step S3 and an exposed portion of the silicon member layer 12 are cleaned. For the cleaning, chemical such as SC1, SC2, SPM, or HF is used. Collapse of patterns occurs more easily as structures forming the patterns have high aspect ratios. This process is at a stage when only the metal member layer 13 of the metal member layer 13 and the silicon member layer 12 is processed and an aspect ratio of the structure 16 is sufficiently low. Therefore, likelihood of occurrence of collapse of patterns is small.

Figure 2G:
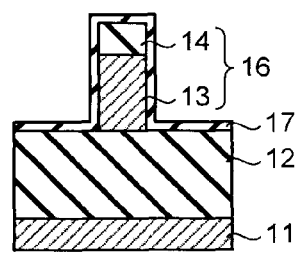

At step S5, as shown in FIG. 2G, a sidewall film 17 is formed on the surface of the structure 16 including the metal member layer 13 and the hard mask 14 and the surface of the silicon member layer 12 exposed by the processing of the metal member layer 13. The sidewall film 17 is a film made of a material that can be silylated by silylation treatment explained later, for example, a silicon oxide film or a silicon nitride film. The thickness of the sidewall film 17 only has to be equal to or larger than thickness equivalent to one layer of molecules and is desirably a degree that can reduce the influence on a process dimension in this process and subsequent processes. The hard mask 14 can be removed before the sidewall film 17 is formed.

Figure 2H:
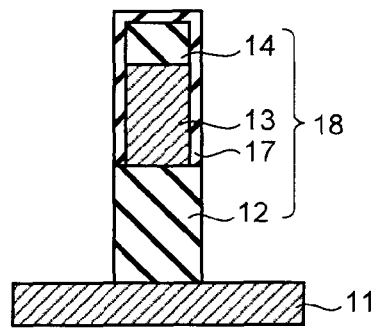

At step S6, as shown in FIG. 2H, the silicon member layer 12 is patterned by dry etching. A structure 18 including the silicon member layer 12 and the metal member layer 13, the surface of which is covered with the sidewall film 17, is formed by patterning the silicon member layer 12.

At step S7, to remove residues caused by the dry etching at step S6, the surface of the structure 18 formed by the process up to step S6 and an exposed portion of the wiring layer 11 is cleaned. For the cleaning, chemical such as SC1, SC2, SPM, or HF is used. At step S8, to remove the chemical used at step S7, the surface of the structure 18 is rinsed by using extrapure water (DIW)

Figure 2I:
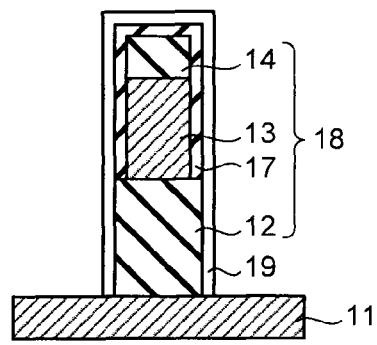

At step S9, as shown in FIG. 2I, a water-repellent protective film 19 is formed on the surface of the structure 18 by silylation treatment. The silylation treatment is performed by supplying a silane coupling agent to the surface of the structure 18 before the DIW used at step S8 dries. When the DIW cannot be sufficiently substituted with the silane coupling agent, processing for substituting the DIW with IPA or thinner can be added after the rinse by the DIW. Specifically, after the surface of the structure 18 is rinsed to remove the chemical, the IPA or the thinner can be supplied to the surface of the structure 18 before the silane coupling agent is supplied.

The silane coupling agent includes, in molecules, a hydrolyzable group having affinity and reactivity with an inorganic material and an organic functional group that can be chemically bonded to an organic material. As the silane coupling agent, for example, hexamethyldisilazane (HMDS), tetramethylsilyldimethylamine (TMSDMA), or tetramethylsilyldiethylamine (TMSDEA) is used.

An OH group generated by contact with the atmosphere is present on the surface of the silicon member layer 12 (a natural oxide film). When the silane coupling agent is supplied to the surface of the silicon member layer 12, O—Si—R is formed on the surface of the silicon member layer 12 by silylation of Si—OH present on the surface of the silicon member layer 12 and R—Si—OH of the silane coupling agent. The water-repellent protective film 19 having water repellency is obtained by a molecule structure in which an R group of O—Si—R faces the outer side.

On the other hand, because the metal member layer 13 does not have an OH group, water-repellent treatment cannot be applied to the metal member layer 13 even if the silane coupling agent is directly supplied to the metal member layer 13. In this embodiment, the sidewall film 17 made of a silicon material is formed on the surface of the metal member layer 13 to silylate the sidewall film 17 and the silane coupling agent. The water-repellent protective film 19 is formed via the sidewall film 17 in a section of the structure 18 formed by the metal member layer 13. In this way, the water-repellent protective film 19 can be formed over the entire surface of the structure 18. In this embodiment, the silylation treatment is explained as water-repellent treatment. However, the water-repellent treatment is not limited to this. The same effect can be obtained even if the water-repellent treatment is treatment performed by using a surface active agent or the like that does not easily adhere to the surface of the metal member layer 13 and easily adheres to the sidewall film 17.

At step S10, the surface of the structure 18 on which the water-repellent protective film 19 is formed is rinsed by using the DIW and the surface of the structure 18 is dried. When necessary, treatment for substituting the silane coupling agent with the IPA or the thinner can be added before the rinse by the DIW. For the drying in this process, for example, a spin drying method, an evaporation drying method, or a vacuum drying method is used. It is also possible to substitute the DIW with, for example, a solvent containing IPA or HFE and dry the solvent.

Figure 2J:
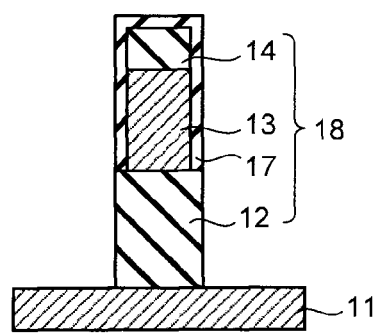

At step S11, as shown in FIG. 2J, the water-repellent protective film 19 is removed by ashing treatment. The ashing treatment is performed by, for example, dry ashing, ozone gas treatment, or UV ray irradiation. The water-repellent protective film 19 only has to be removed when necessary or can be left. For example, to improve an electric characteristic of a memory cell in a ReRAM, it is desirable to remove the water-repellent protective film 19.

Figure 3:
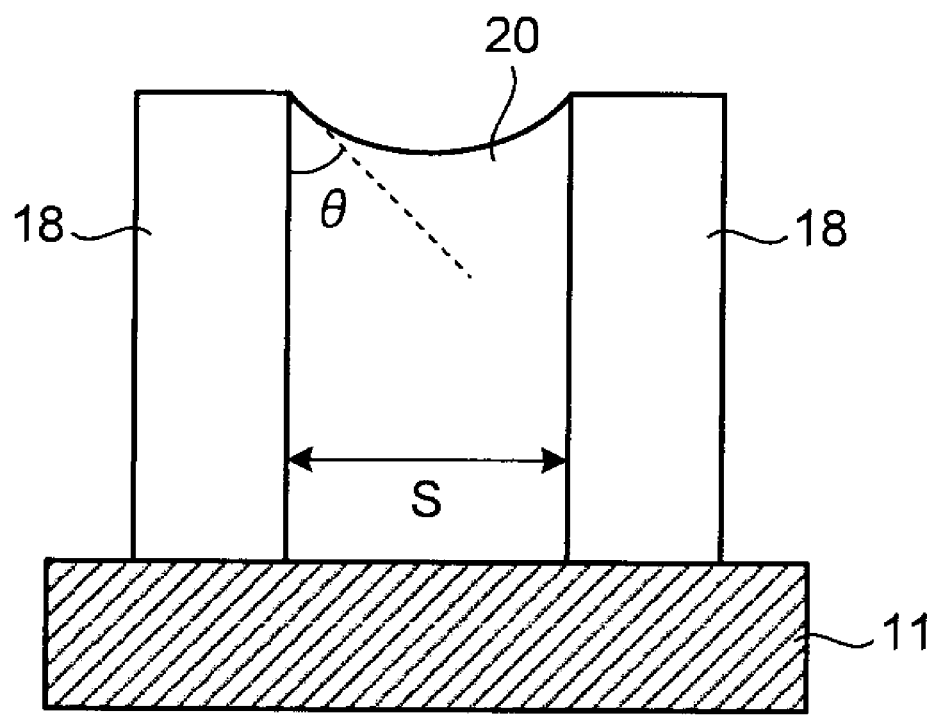
FIG. 3 is a diagram of a state in which a part of patterns formed on a wiring layer is wet with liquid.

FIG. 3 is a diagram of a state in which a part of a pattern formed on the wiring layer 11 is wet with liquid 20. A collapsing phenomenon of patterns due to drying treatment is considered to be caused by capillary force between structures 18 forming the pattern. When the surface tension of the liquid 20 is represented as $\gamma$, an angle (a contact angle) formed by the surface of the structure of the structures 18 and the liquid surface is represented as $\theta$, a level difference of the liquid surface between the structures 18 is represented as $\Delta H$, and space width between the structures 18 is represented as S, force F that collapses the pattern is given by the following Formula (1):

$$F = 2\gamma \cos\theta \cdot \Delta H/S \qquad (1)$$

ΔH is a parameter generally determined by the height of the structures 18. ΔH/S is a parameter generally determined by an aspect ratio of the structures 18. According to Formula (1), the force F increases in proportion to ΔH/S. Therefore, the collapsing phenomenon of the pattern more easily occurs as the aspect ratio of the structures 18 is higher.

In this embodiment, the water-repellent protective film 19 is formed on the surface of the structure 18 to reduce wettability of the structures 18. According to the water-repellent action of the water-repellent protective film 19, the contact angle θ increases (close to 90°) and the capillary force between the structures 18 is reduced. This makes it possible to suppress collapse of the pattern in the drying treatment. This embodiment is suitable for manufacturing of a fine pattern including the metal member layer 13 in an upper layer and the silicon member layer 12 in a lower layer and having a high aspect ratio.

FIGS. 4A to 4F are schematic sectional views for explaining a process by a method of manufacturing a semiconductor device according to a second embodiment of the present invention. In this embodiment, manufacturing of a pattern formed by a structure including a first metal member layer 31, the silicon member layer 12, and a second metal member layer 32 includes a process for forming the sidewall film 17 on the surface of the second metal member layer 32. Components same as those in the first embodiment are denoted by the same reference numerals and redundant explanation is omitted.

Figure 4A:
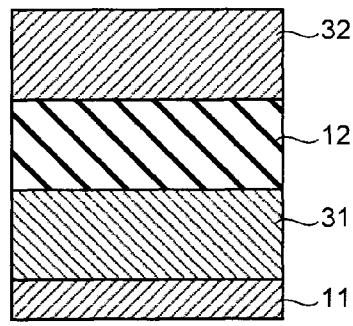
FIGS. 4A to 4F are schematic sectional views for explaining a process by a method of manufacturing a semiconductor device according to a second embodiment of the present invention.

As shown in FIG. 4A, the first metal member layer 31, the silicon member layer 12, and the second metal member layer 32 are sequentially formed on the wiring layer 11. The first metal member layer 31 and the second metal member layer 32 are formed by using a metal material. The first metal member layer 31 is a metal member layer provided between the wiring layer 11 and the silicon member layer 12. The second metal member layer 32 is a metal member layer formed on the silicon member layer 12. The silicon member layer 12 is provided between the first metal member layer 31 and the second metal member layer 32.

Figure 4B:
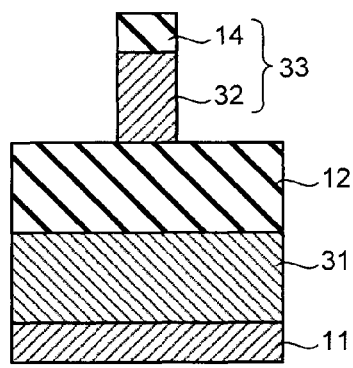

Subsequently, the hard mask 14 is formed on the second metal member layer 32. As shown in FIG. 4B, the hard mask 14 and the second metal member layer 32 are patterned. The hard mask 14 and the second metal member layer 32 are patterned by processing same as steps S2 and S3 (see FIG. 1) in the first embodiment. In this process, the silicon member layer 12 and the first metal member layer 31 are not processed. The surface of a structure 33 including the hard mask 14 and the second metal member layer 32 and an exposed portion of the silicon member layer 12 are cleaned. In this embodiment, as in the first embodiment, for the cleaning, chemical such as SC1, SC2, SPM, or HF is used. This process is at a stage when only the second metal member layer 32 of the silicon member layer 12 and the second metal member layer 32 is processed. Likelihood of collapse of the pattern is small because an aspect ratio of the structure 33 is sufficiently low.

Figure 4C:
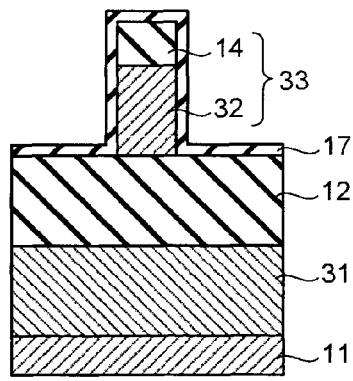
Figure 4D:
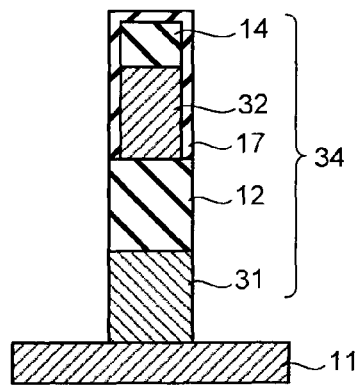

As shown in FIG. 4C, the side wall film 17 is formed on the surface of the structure 33 and the surface of the silicon member layer 12 exposed by the processing of the second metal member layer 32. The hard mask 14 can be removed before the sidewall film 17 is formed. As shown in FIG. 4D, the silicon member layer 12 and the first metal member layer 31 are patterned by dry etching. A structure 34 including the first metal member layer 31, the silicon member layer 12, and the second metal member layer 32, the surface of which is covered with the sidewall film 17, is formed by patterning the silicon member layer 12 and the first metal member layer 31.

Figure 4E:
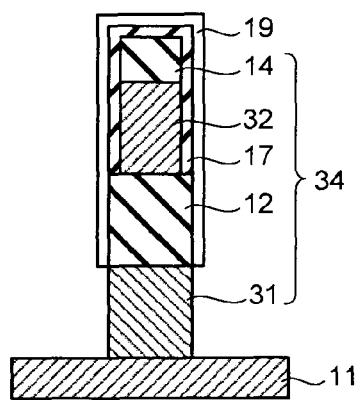
Figure 4F:
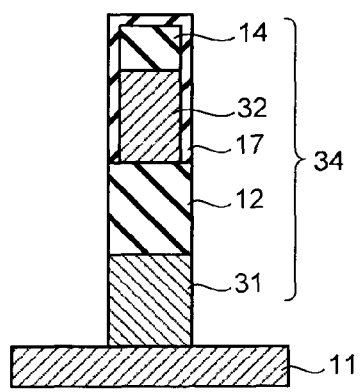

In the same manner as steps S7 and S8 in the first embodiment, the surface of the structure 34 and the exposed portion of the wiring layer 11 are cleaned and rinse processing by DIW is applied thereto. As shown in FIG. 4E, the water-repellent protective film 19 is formed by silylation treatment on the surface of a section other than a section formed by the first metal member layer 31 in the structure 34. The silylation treatment is performed by supplying the silane coupling agent to the surface of the structure 34 before the DIW dries. In this embodiment, as in the first embodiment, after the chemical is removed by rinsing the surface of the structure 34, IPA or thinner can be supplied to the surface of the structure 34 before the silane coupling agent is supplied.

Silylation occurs in a section formed by the silicon member layer 12 and a section covered with the sidewall film 17 in the structure 34 and does not occur in a section formed by the first metal member layer 31. In this way, the water-repellent protective film 19 is formed on the surface of the section other than the section formed by the first metal member layer 31 in the structure 34. After the silylation treatment, in the same manner as steps S10 and S11 in the first embodiment, rinse treatment, drying, and ashing treatment are applied to the structure 34. In this embodiment, as in the first embodiment, the water-repellent protective film 19 only has to be removed when necessary or can be left.

In this embodiment, water-repellent treatment is applied to the sections formed by the second metal member layer 32 and the silicon member layer 12 in the structure 34 and is not applied to the section formed by the first metal member layer 31. When the liquid surface is present in the position of the section of the second metal member layer 32 and the position of the section of the silicon member layer 12 in the structure 34, the contact angle θ of Formula (1) is increased to be close to 90° and the capillary force between structures 34 is reduced by the water-repellent action of the water-repellent protective film 19.

When the water surface is present in the position of the section of the first metal member layer 31 in the structure 34, the structure 34 is subjected to the capillary force. Force F that collapses the structure 34 substantially depends on the thickness of the first metal member layer 31. The force F can be reduced by reducing the thickness of the first metal member layer 31 with respect to the height of the structure 34. In this embodiment, as in the first embodiment, this makes it possible to suppress collapse of the pattern in the drying treatment. A structure manufactured according to this embodiment only has to be a structure having a silicon member layer between metal member layers and is not limited to the structure explained in this embodiment. For example, a structure including three or more metal member layers can be manufactured by applying this embodiment.

Figure 5:
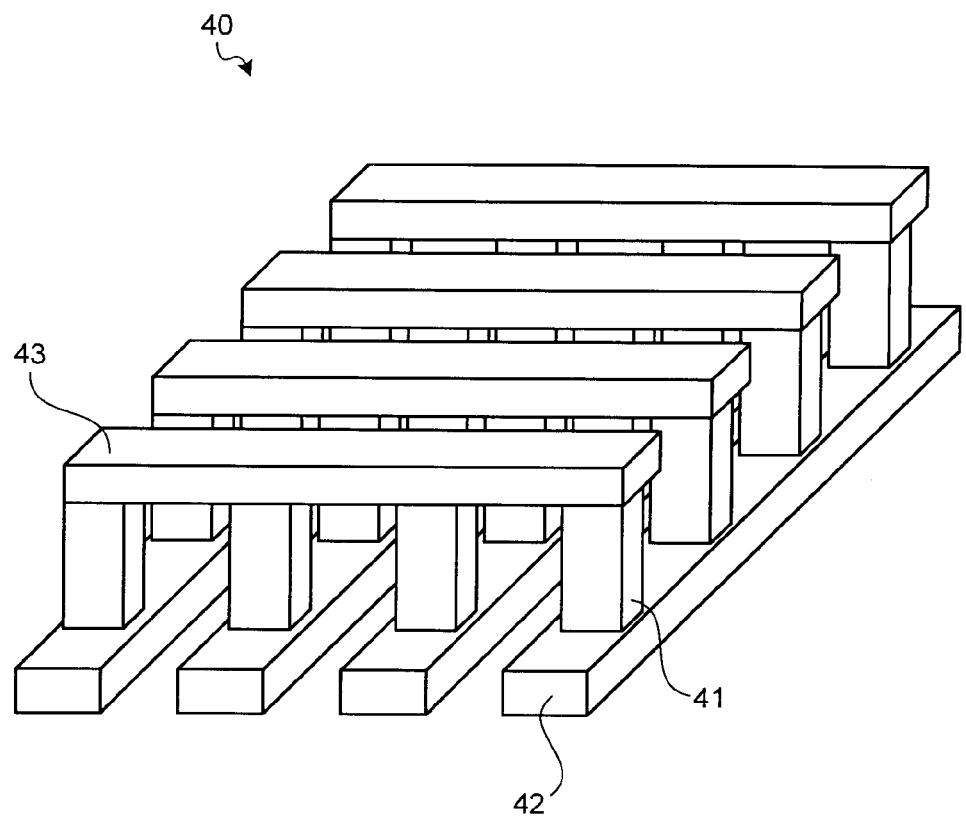
FIG. 5 is a partial schematic diagram of a ReRAM as an example of a semiconductor device.

FIG. 5 is a partial schematic diagram of a ReRAM 40 as an example of a semiconductor device manufactured according to the first embodiment or the second embodiment. The ReRAM 40 includes a plurality of memory cells 41 arranged in a matrix shape. Bit lines 42 and word lines 43 are wiring layers wired to cross each other. The memory cells 41 are arranged in positions where the bit lines 42 and the word lines 43 cross each other. The ReRAM 40 is a multi-layer memory formed in a three-dimensional structure in which the bit lines 42 and the word lines 43 are further alternately stacked via the memory cells 41 in the configuration shown in the figure.

Figure 6:
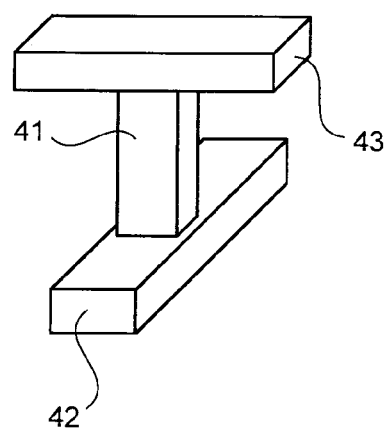
FIG. 6 is a diagram of one memory cell, a bit line under the memory cell, and a word line on the memory cell extracted from FIG. 5.

FIG. 6 is a diagram of one memory cell 41, the bit line 42 under the memory cell 41, and the word line 43 on the memory cell 41 extracted from FIG. 5. The memory cell 41 is formed by using a silicon member layer and a metal member layer. The structure 18 (see FIG. 2H) in the first embodiment and the structure 34 (see FIG. 4D) in the second embodiment are equivalent to the section of the memory cell 41. The wiring layer 11 in the first and second embodiments is equivalent to the sections of the bit line 42 and the word line 43.

Figure 7A:
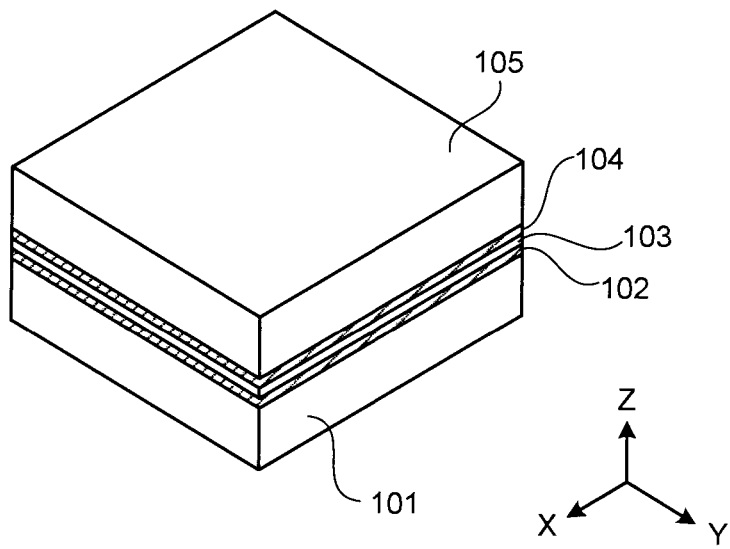
FIGS. 7A to 7E are schematic perspective views for explaining an example of a process for manufacturing a ReRAM.

FIGS. 7A to 7E are schematic perspective views for explaining an example of a process for manufacturing the ReRAM 40. An example in which a method of manufacturing a semiconductor device according to an embodiment of the present invention is applied to a manufacturing process for the ReRAM 40 is explained with reference to FIGS. 7A to 7E. First, as shown in FIG. 7A, a tungsten film 101, a tungsten nitride film 102, a Ti-doped NiOx film 103, a tungsten nitride film 104, and a P-doped polysilicon film 105 are sequentially formed.

The tungsten film 101 is stacked, for example, on (on a principal plane) of a substrate (not shown) formed by using a semiconductor material. The tungsten film 101 is a first wiring layer that functions as the bit lines 42 (see FIG. 5). The tungsten film 101 is formed with thickness of, for example, 50 nanometers. The tungsten film 101 is the bit lines 42 in a lowermost layer formed on the substrate and can also be the bit lines 42 formed in second and higher layers.

The tungsten nitride film 102 is stacked on an upper surface (on a principal plane) of a processed body in which the tungsten film 101 is formed. The tungsten nitride film 102 is a layer that functions as an electrode layer of a recording section. The tungsten nitride film 102 is formed with thickness of, for example, 10 nanometers. The Ti-doped NiOx film 103 is a layer that functions as a resistance changing layer (a recording layer) of the recording section. The Ti-doped NiOx film 103 is formed with thickness of, for example, 10 nanometers. The tungsten nitride film 104 is a layer that functions as an electrode layer of the recording section. The tungsten nitride film 104 is formed with thickness of, for example, 10 nanometers.

The P-doped polysilicon film 105 functions as a CMP stopper layer that is a stopper in planarization processing by chemical mechanical polishing (CMP). The P-doped polysilicon film 105 is a silicon member layer that also functions as an n-type semiconductor layer forming a part of a rectifying element layer (a PIN diode). The P-doped polysilicon film 105 is formed with thickness of, for example, 50 nanometers.

Figure 7B:
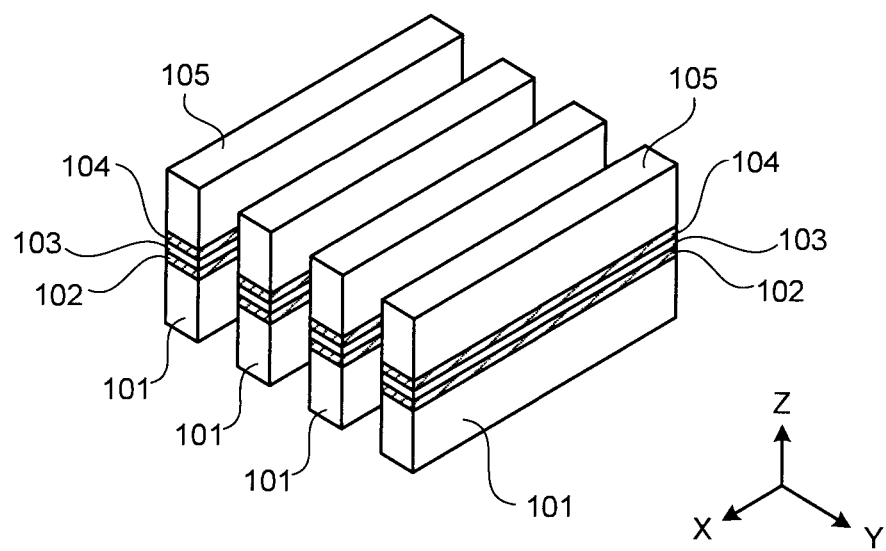

As shown in FIG. 7B, a stacked body including layers of the P-doped polysilicon film 105 to the tungsten film 101 is patterned by collective processing in a line shape extending in an X axis direction as a first direction. For the patterning, the lithography technology and the reactive ion etching are used. The etching is applied up to the position of an interface between the substrate and the tungsten film 101. Consequently, patterns formed by stacked bodies including tungsten films 101 to P-doped polysilicon films 105 are formed on the substrate.

Figure 7C:
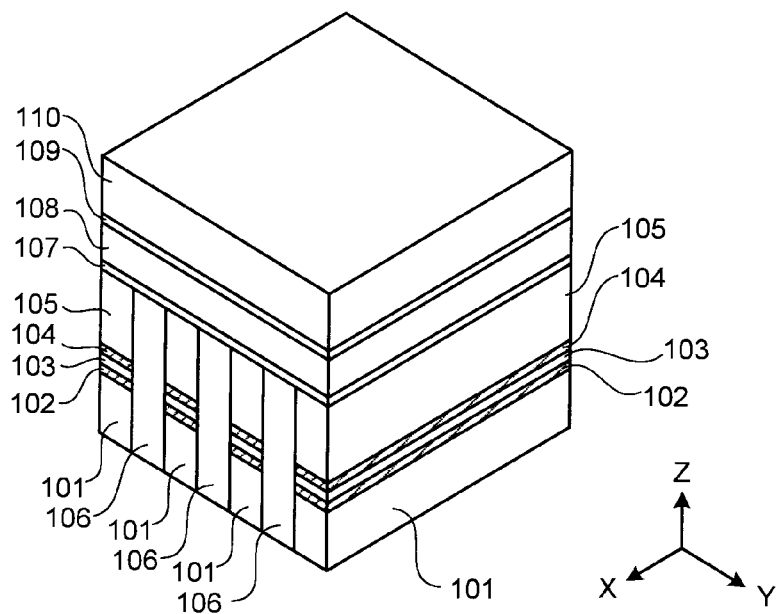

As shown in FIG. 7C, interlayer insulating films 106, a non-doped polysilicon film 107, a B-doped polysilicon film 108, a tungsten nitride film 109, and a tungsten film 110 are sequentially formed. The interlayer insulating films 106 are formed by embedding an insulative material among the patterns obtained by the etching. The upper surfaces of the processed bodies embedded with the insulative material are planarized by CMP to expose the P-doped polysilicon films 105, which are the CMP stopper layers, on the upper surfaces of the processed bodies.

The non-doped polysilicon film 107 is stacked on the upper surfaces of the processed bodies on which the P-doped polysilicon films 105 are exposed. The non-doped polysilicon film 107 is a silicon member layer that functions as an intrinsic semiconductor layer of a rectifying element layer. The non-doped polysilicon film 107 is formed with thickness of, for example, 10 nanometers. The B-doped polysilicon film 108 is a silicon member layer that functions as a p-type semiconductor layer of the rectifying element layer. The B-doped polysilicon film 108 is formed with thickness of, for example, 30 nanometers.

The tungsten nitride film 109 is a layer that functions as a barrier layer. The tungsten nitride film 109 is formed with thickness of, for example, 10 nanometers. The tungsten film 110 is a second wiring layer that functions as the word lines 43 (see FIG. 5). The tungsten film 110 is formed with thickness of, for example, 50 nanometers.

Figure 7D:
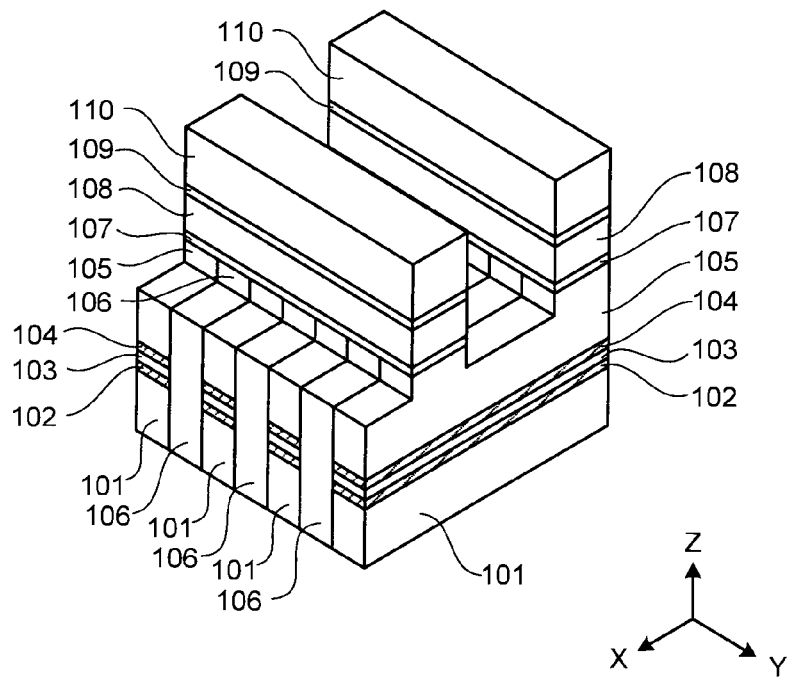

The tungsten film 110 and the tungsten nitride film 109 are patterned in a line shape extending in a Y axis direction by processing. The Y axis direction is a second direction non-parallel to the first direction. For the patterning, the lithography technology and the reactive ion etching are used. The etching is selectively stopped in the position of the B-doped polysilicon film 108. Subsequently, a sidewall film (not shown) is formed to cover the surfaces of tungsten films 110 and tungsten nitride films 109. The layers of the sidewall film to the P-doped polysilicon films 105 are patterned in a line shape extending in the Y axis direction by processing. For the patterning, the lithography technology and the reactive ion etching are used. The etching is stopped halfway in the P-doped polysilicon films 105. Consequently, as shown in FIG. 7D, a structure is obtained in which the tungsten films 110 and the tungsten nitride films 109, the surfaces of which are covered with the sidewall film, up to a part of the P-doped polysilicon films 105 are patterned in a line shape extending in the Y axis direction. To remove residues caused by the etching, the surface of the structure is cleaned by using chemical. The chemical is removed from the surface of the structure. To prevent collapse of the patterns in the drying process, silylation treatment is performed. After the silylation treatment is performed, the structure is rinsed and a normal drying process is performed. In this way, it is possible to clean a processed surface while preventing collapse of the patterns.

Thereafter, oxidation treatment is applied to the processed bodies obtained by the etching. For example, the oxidation treatment is applied to the processed bodies under temperature equal to or higher than 800° C. in hydrogen/oxygen mixed gas atmosphere in an oven. The P-doped polysilicon films 105, the non-doped polysilicon films 107, and the B-doped polysilicon films 108 forming rectifying element layers in the sides of the processed bodies are selectively oxidized to form silicon thermal oxide films on the surfaces of the processed bodies. The oxidation treatment makes it possible to improve an interface characteristic of the rectifying element layers.

In some case, it is not desirable to oxidize the tungsten films 101 functioning as the bit lines 42, the tungsten nitride films 102 and 104 functioning as the electrode layers, the Ti-doped NiOx films 103 functioning as the resistance changing layers, the tungsten nitride films 108 functioning as the barrier layers, and the tungsten films 110 functioning as the word lines 43 because conductivity, a resistance changing characteristic, and the like change. On the other hand, the interlayer insulating films 106 formed before the oxidation treatment cover the sides of the layers to play a function of suppressing oxidation. Tungsten or a tungsten compound used as the wiring layers, the electrode layers, and the barrier layers has a characteristic that the tungsten or the tungsten compound is relatively less easily oxidized. This makes it possible to selectively oxidize the sections of the processed bodies forming the rectifying element layers.

Figure 7E:
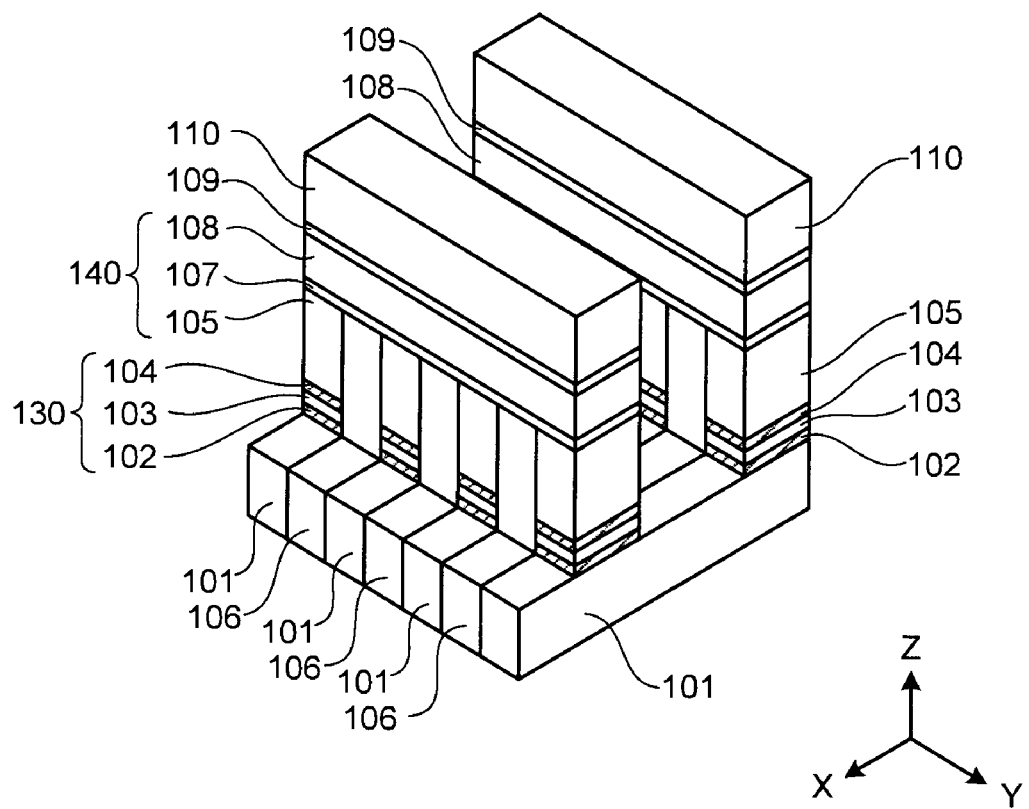

As shown in FIG. 7E, the remaining sections of the P-doped polysilicon films 105, the tungsten nitride films 104, the Ti-doped NiOx films 103, and the tungsten nitride films 102 are processed in a line shape extending in the Y axis direction. For the processing, reactive ion etching is used. The etching is applied up to the position of interfaces between the tungsten films 101 and the tungsten nitride films 102. Interlayer insulating films (not shown) are formed among patterns obtained by the etching by embedding an insulative material therein.

The tungsten nitride films 102, the Ti-doped NiOx layers 103, and the tungsten nitride films 104 form recording sections 130 of a resistance changing type. The P-doped polysilicon films 105, the non-doped polysilicon films 107, and the B-doped polysilicon films 108 form rectifying element layers 140. The P-doped polysilicon films 105 form projections projected to correspond to the recording sections 130 in the rectifying element layers 140.

In this way, the memory cells 41 including the recording section 130 and the P-doped polysilicon films 105 are formed in sections where the tungsten films 101 functioning as the bit lines 42 and the tungsten films 110 functioning as the word lines 43 cross each other. The ReRAM 40 as a multi-layer memory is manufactured by stacking the layers in a Z axis direction by repeating the process explained above. The Z axis direction is a third direction non-parallel to the X axis direction and the Y axis direction.

It is possible to suppress collapse of patterns and improve the yield of the ReRAM 40 by forming patterns on the wiring layers using the manufacturing methods according to the first and second embodiments. The manufacturing methods according to the first and second embodiments can be applied to formation of patterns including silicon member layers and metal member layers and is particularly useful for manufacturing fine patterns having a high aspect ratio. The layers forming the patterns can be stacked as appropriate according to a semiconductor device to be manufactured. The manufacturing methods according to the embodiments are not limited to the application to the manufacturing of the ReRAM 40 and can be widely applied to structures having sectional configurations same as the sectional configurations referred to in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
   forming a silicon member layer using a silicon material;
   forming a metal member layer using a metal material on the silicon member layer;
   patterning the metal member layer;
   forming a sidewall film on a surface of the patterned metal member layer;
   patterning the silicon member layer to thereby form a structure including the silicon member layer and the metal member layer, the surface of which is covered with the sidewall film;
   cleaning a surface of the structure using chemical;
   forming a water-repellent protective film on the surface of the structure;
   rinsing the surface of the structure on which the water-repellent protective film is formed; and
   drying the surface of the structure.

2. The method of manufacturing a semiconductor device according to claim 1, further comprising supplying a silane coupling agent to the surface of the structure to thereby form the water-repellent protective film.

3. The method of manufacturing a semiconductor device according to claim 2, further comprising, after rinsing the surface of the structure to thereby remove the chemical, supplying the silane coupling agent before the surface of the structure dries.

4. The method of manufacturing a semiconductor device according to claim 2, further comprising, after removing the chemical, supplying isopropyl alcohol or thinner to the surface of the structure before supplying the silane coupling agent.

5. The method of manufacturing a semiconductor device according to claim 1, wherein the sidewall film is formed by using a silicon material.

6. The method of manufacturing a semiconductor device according to claim 1, further comprising removing the water-repellent protective film after drying the surface of the structure.

7. The method of manufacturing a semiconductor device according to claim 6, further comprising removing the water-repellent protective film with ashing treatment.

8. A method of manufacturing a semiconductor device comprising:
   forming a first metal member layer using a metal material;
   forming a silicon member layer using a silicon material on the first metal member layer;
   forming a second metal member layer using a metal material on the silicon member layer;
   patterning the second metal member layer;
   forming a sidewall film on a surface of the patterned second metal member layer;
   patterning the silicon member layer and the first metal member layer to thereby form a structure including the first metal member layer, the silicon member layer, and the second metal member layer, the surface of which is covered with the sidewall film;
   cleaning a surface of the structure using chemical;
   forming a water-repellent protective film on the surface of the structure;
   rinsing the surface of the structure on which the water-repellent protective film is formed; and
   drying the surface of the structure.

9. The method of manufacturing a semiconductor device according to claim 8, further comprising supplying a silane coupling agent to the surface of the structure to thereby form the water-repellent protective film.

10. The method of manufacturing a semiconductor device according to claim 9, further comprising, after rinsing the surface of the structure to thereby remove the chemical, supplying the silane coupling agent before the surface of the structure dries.

11. The method of manufacturing a semiconductor device according to claim 9, further comprising, after removing the chemical, supplying isopropyl alcohol or thinner to the surface of the structure before supplying the silane coupling agent.

12. The method of manufacturing a semiconductor device according to claim 8, wherein the sidewall film is formed by using a silicon material.

13. The method of manufacturing a semiconductor device according to claim 8, further comprising removing the water-repellent protective film after drying the surface of the structure.

14. The method of manufacturing a semiconductor device according to claim 13, further comprising removing the water-repellent protective film with ashing treatment.

15. A method of manufacturing a semiconductor device comprising:
- patterning, in a line shape extending in a first direction, a stacked body including a first wiring layer and a recording layer and an electrode layer forming a recording section;
- forming, on the patterned stacked body, a silicon member layer forming a rectifying element layer, a barrier layer, and a second wiring layer;
- patterning the second wiring layer and the barrier layer in a line shape extending in a second direction non-parallel to the first direction;
- forming a sidewall film on surfaces of the patterned second wiring layer and barrier layer;
- patterning the silicon member layer in a line shape extending in the second direction to thereby form a structure including the silicon member layer and the second wiring layer and the barrier layer, the surfaces of which are covered with the sidewall film;
- cleaning a surface of the structure using chemical;
- forming a water-repellent protective film on the surface of the structure;
- rinsing the surface of the structure on which the water-repellent protective film is formed;
- drying the surface of the structure; and
- forming a memory cell including the recording section in a section where the first wiring layer and the second wiring layer cross each other.

16. The method of manufacturing a semiconductor device according to claim 15, further comprising supplying a silane coupling agent to the surface of the structure to thereby form the water-repellent protective film.

17. The method of manufacturing a semiconductor device according to claim 15, further comprising forming, with oxidation treatment, a silicon thermal oxide film on a surface of the silicon member layer.

18. The method of manufacturing a semiconductor device according to claim 15, further comprising forming an interlayer insulating film between patterns formed by the stacked body.

19. The method of manufacturing a semiconductor device according to claim 15, wherein at least one of the first wiring layer, the electrode layer, the barrier layer, and the second wiring layer includes tungsten or a tungsten compound.

20. The method of manufacturing a semiconductor device according to claim 15, further comprising alternately stacking the first wiring layer and the second wiring layer via the memory cell.

* * * * *